United States Patent
Chen et al.

(10) Patent No.: US 10,081,188 B2
(45) Date of Patent: Sep. 25, 2018

(54) MOLDED FLUID FLOW STRUCTURE WITH SAW CUT CHANNEL

(71) Applicant: HEWLETT-PACKARD DEVELOPMENT COMPANY, L.P., Houston, TX (US)

(72) Inventors: Chien-Hua Chen, Corvallis, OR (US); Michael W Cumbie, Corvallis, OR (US); Arun K Agarwal, Corvallis, OR (US)

(73) Assignee: HEWLETT-PACKARD DEVELOPMENT COMPANY, L.P., Houston, TX (US)

(*) Notice: Subject to any disclaimer, the term of this patent is extended or adjusted under 35 U.S.C. 154(b) by 0 days.

(21) Appl. No.: 15/485,064

(22) Filed: Apr. 11, 2017

(65) Prior Publication Data

US 2017/0217184 A1    Aug. 3, 2017

Related U.S. Application Data

(63) Continuation of application No. 14/770,344, filed as application No. PCT/US2013/048214 on Jun. 27, 2013, now Pat. No. 9,656,469.

(30) Foreign Application Priority Data

Feb. 28, 2013  (WO) ............... PCT/US2013/028207
Feb. 28, 2013  (WO) ............... PCT/US2013/028216
(Continued)

(51) Int. Cl.
*B41J 2/14*     (2006.01)
*B41J 2/16*     (2006.01)
*B29C 69/00*   (2006.01)

(52) U.S. Cl.
CPC ........... *B41J 2/1632* (2013.01); *B29C 69/001* (2013.01); *B41J 2/1433* (2013.01); *B41J 2/162* (2013.01); *B41J 2002/14419* (2013.01)

(58) Field of Classification Search
CPC ......... B41J 2/1433; B41J 2/163; B41J 2/1632
See application file for complete search history.

(56) References Cited

U.S. PATENT DOCUMENTS

| 4,633,274 A | 12/1986 | Matsuda |
| 4,873,622 A | 10/1989 | Komuro et al. |

(Continued)

FOREIGN PATENT DOCUMENTS

| CN | 101668696 | 3/2010 |
| CN | 102470672 | 5/2012 |

(Continued)

OTHER PUBLICATIONS

Lindemann et al.: One Inch Thermal Bubble Jet Printhead with Laser Structured Integrated Polyimide Nozzle Plate; Journal of Microelectromechanical Systems, vol. 16 No. 2, Apr. 2007 (pp. 420-428).

*Primary Examiner* — Jason Uhlenhake
(74) *Attorney, Agent, or Firm* — HP Inc.—Patent Department (57) ABSTRACT

In an embodiment, a fluid flow structure includes a micro device embedded in a molding. A fluid feed hole is formed through the micro device, and a saw defined fluid channel is cut through the molding to fluidically couple the fluid feed hole with the channel.

20 Claims, 11 Drawing Sheets

(30) Foreign Application Priority Data

Mar. 20, 2013  (WO) ................ PCT/US2013/033046
Mar. 26, 2013  (WO) ................ PCT/US2013/033865

(56) References Cited

U.S. PATENT DOCUMENTS

| | | |
|---|---|---|
| 6,188,414 B1 | 2/2001 | Wong et al. |
| 6,250,738 B1 | 6/2001 | Waller et al. |
| 6,254,819 B1 | 7/2001 | Chatterjee et al. |
| 6,291,317 B1 | 9/2001 | Salatino et al. |
| 6,543,879 B1 | 4/2003 | Feinn et al. |
| 6,554,399 B2 | 4/2003 | Wong et al. |
| 6,767,089 B2 | 7/2004 | Buswell et al. |
| 6,930,055 B1 | 8/2005 | Bhowmik et al. |
| 6,962,406 B2 | 11/2005 | Kawamura et al. |
| 7,051,426 B2 | 5/2006 | Buswell |
| 7,490,924 B2 | 2/2009 | Haluzak et al. |
| 7,658,470 B1 | 2/2010 | Jones et al. |
| 8,246,141 B2 | 8/2012 | Petruchik et al. |
| 2002/0180825 A1* | 12/2002 | Buswell ............. B41J 2/14145 347/20 |
| 2003/0140496 A1 | 7/2003 | Buswell et al. |
| 2004/0032468 A1 | 2/2004 | Killmeier et al. |
| 2004/0055145 A1 | 3/2004 | Buswell |
| 2004/0084404 A1 | 5/2004 | Donaldson et al. |
| 2005/0024444 A1 | 2/2005 | Conta et al. |
| 2006/0243387 A1 | 11/2006 | Haluzak et al. |
| 2007/0153070 A1 | 7/2007 | Haines et al. |
| 2008/0079781 A1 | 4/2008 | Shim et al. |
| 2008/0259125 A1 | 10/2008 | Haluzak et al. |
| 2008/0297564 A1 | 12/2008 | Jeong et al. |
| 2009/0225131 A1 | 9/2009 | Chen et al. |
| 2009/0267994 A1 | 10/2009 | Suganuma et al. |
| 2010/0271445 A1 | 10/2010 | Sharan et al. |
| 2011/0037808 A1 | 2/2011 | Ciminelli et al. |
| 2011/0080450 A1 | 4/2011 | Ciminelli et al. |
| 2011/0292126 A1 | 12/2011 | Nystrom et al. |
| 2011/0298868 A1 | 12/2011 | Fielder et al. |
| 2012/0019593 A1 | 1/2012 | Scheffelin et al. |

FOREIGN PATENT DOCUMENTS

| | | |
|---|---|---|
| CN | 102596575 | 7/2012 |
| EP | 1095773 | 5/2001 |
| EP | 1386740 A1 | 2/2004 |
| EP | 1908593 | 4/2008 |
| JP | S62240562 | 10/1987 |
| JP | H04-292950 | 10/1992 |
| JP | H06-015824 | 1/1994 |
| JP | H06-226977 | 8/1994 |
| JP | H07-227970 | 8/1995 |
| JP | H09-029970 | 2/1997 |
| JP | H09-131871 | 5/1997 |
| JP | 2000108360 A | 4/2000 |
| JP | 2000108360 | 4/2001 |
| JP | 2001-246748 | 9/2001 |
| JP | 2003-011365 | 1/2003 |
| JP | 2003011365 | 1/2003 |
| JP | 2003063020 A | 5/2003 |
| JP | 2005088587 | 4/2005 |
| JP | 2006009149 | 1/2006 |
| JP | 2006315321 | 11/2006 |
| JP | 2006315321 A | 11/2006 |
| JP | 2006321222 | 11/2006 |
| JP | 2008087478 | 4/2008 |
| JP | 2010524713 | 7/2010 |
| JP | 2012158150 | 8/2012 |
| JP | 2013501655 | 1/2013 |
| WO | WO2008151216 | 12/2008 |
| WO | WO 2011058719 | 5/2011 |
| WO | 2012134480 | 10/2012 |

* cited by examiner

MOLDED FLUID FLOW STRUCTURE WITH SAW CUT CHANNEL

CROSS-REFERENCE TO RELATED APPLICATIONS

This application is a Continuation Application of U.S. application Ser. No. 14/770,344, filed Aug. 25, 2015, which is a U.S. National Stage Application of International Application No. PCT/US2013/048214, filed Jun. 27, 2013, and which claims priority to International Application No. PCT/US2013/028207, filed Feb. 28, 2013, International Application No. PCT/US2013/028216, filed Feb. 28, 2013, International Application No. PCT/US2013/033046, filed Mar. 20, 2013, and International Application No. PCT/US2013/033865, filed Mar. 26, 2013, each of which is incorporated herein by reference.

BACKGROUND

A printhead die in an inkjet pen or print bar includes a plurality of fluid ejection elements on a surface of a silicon substrate. Fluid flows to the ejection elements through a fluid delivery slot formed in the substrate between opposing substrate surfaces. While fluid delivery slots adequately deliver fluid to fluid ejection elements, there are some disadvantages with such slots. From a cost perspective, for example, ink delivery slots occupy valuable silicon real estate and add significant slot processing cost. In addition, lower printhead die cost is achieved in part through die shrink, which is associated with tighter slot pitch and/or slot width in the silicon substrate. However, shrinking the slot pitch adds excessive assembly costs associated with integrating a small die into the inkjet pen. Structurally, removing material from the substrate to form an ink delivery slot weakens the printhead die. Thus, when a single printhead die has multiple slots (e.g., to improve print quality and speed in a single color printhead die, or to provide different colors in a multicolor printhead die), the printhead die becomes increasingly fragile with the addition of each slot.

BRIEF DESCRIPTION OF THE DRAWINGS

The present embodiments will now be described, by way of example, with reference to the accompanying drawings, in which.

Throughout the drawings, identical reference numbers designate similar, but not necessarily identical, elements.

DETAILED DESCRIPTION

Overview

Reducing the cost of conventional inkjet printhead dies has been achieved in the past through shrinking the die size and reducing wafer costs. The die size depends significantly on the pitch of fluid delivery slots that deliver ink from a reservoir on one side of the die to fluid ejection elements on another side of the die. Therefore, prior methods used to shrink the die size have mostly involved reducing the slot pitch and size through a silicon slotting process that can include, for example, laser machining, anisotropic wet etching, dry etching, combinations thereof, and so on. Unfortunately, the silicon slotting process itself adds considerable cost to the printhead die. In addition, successful reductions in slot pitch are increasingly met with diminishing returns, as the costs associated with integrating the shrinking die (resulting from the tighter slot pitch) with an inkjet pen have become excessive.

A fluid flow structure enables the use of smaller printhead dies and a simplified method of forming fluid delivery channels to deliver ink from a reservoir on one side of a printhead die to fluid ejection elements on another side of the die. The fluid flow structure includes one or more printhead dies molded into a monolithic body of plastic, epoxy mold compound, or other moldable material. For example, a print bar implementing the new structure includes multiple printhead dies molded into an elongated, singular molded body. The molding enables the use of smaller dies by offloading the fluid delivery channels (i.e., the ink delivery slots) from the die to the molded body of the structure. Thus, the molded body effectively grows the size of each die for making external fluid connections and for attaching the dies to other structures. Fluid delivery channels are formed in the fluid flow structure using a cutting saw to plunge cut through the molded body.

The described fluid flow structure is not limited to print bars or other types of printhead structures for inkjet printing, but may be implemented in other devices and for other fluid flow applications. Thus, in one example, the new structure includes a micro device embedded in a molding having a channel or other path for fluid to flow directly into or onto the device. The micro device, for example, could be an electronic device, a mechanical device, or a microelectromechanical system (MEMS) device. The fluid flow, for example, could be a cooling fluid flow into or onto the micro device or fluid flow into a printhead die or other fluid dispensing micro device. These and other examples shown in the figures and described below illustrate but do not limit the invention, which is defined in the Claims following this Description.

As used in this document, a "micro device" means a device having one or more exterior dimensions less than or equal to 30 mm; "thin" means a thickness less than or equal to 650 μm; a "sliver" means a thin micro device having a ratio of length to width (L/W) of at least three; a "printhead structure" and a "printhead die" mean that part of an inkjet printer or other inkjet type dispenser that dispenses fluid from one or more openings. A printhead structure includes one or more printhead dies. "Printhead structure" and "printhead die" are not limited to printing with ink and other printing fluids but also include inkjet type dispensing of other fluids for uses other than or in addition to printing.

Illustrative Embodiments

Figure 1:
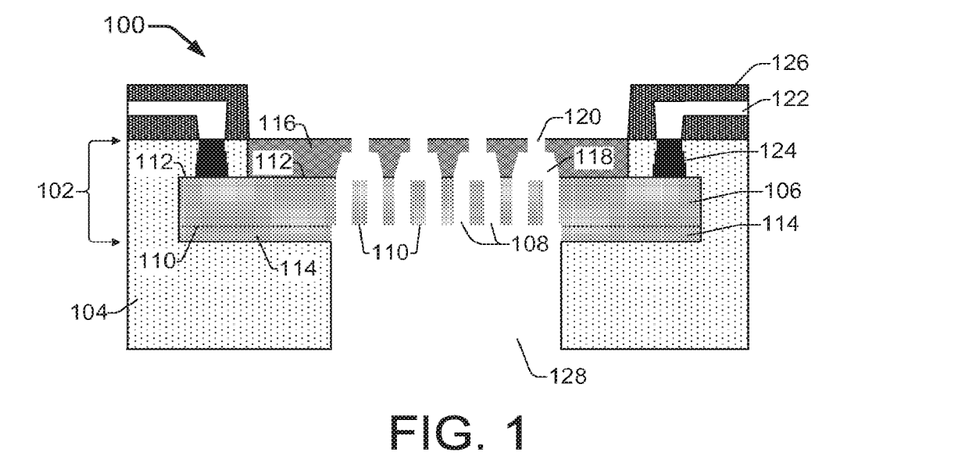
FIG. 1 is an elevation section view illustrating one example of a molded fluid flow structure implemented as a printhead structure.

FIG. 1 is an elevation section view illustrating one example of a molded fluid flow structure 100 implemented as a printhead structure 100 that is suitable for use in a print bar of an inkjet printer. The printhead structure 100 includes a micro device 102 molded into a monolithic body 104 of plastic or other moldable material. A molded body 104 may also be referred to herein as a molding 104. In general, a micro device 102 could be, for example, an electronic device, a mechanical device, or a microelectromechanical system (MEMS) device. In the present printhead structure 100 of FIG. 1, micro device 102 is implemented as a printhead die 102. Printhead die 102 includes a silicon die substrate 106 comprising a silicon sliver on the order of 100 microns in thickness. The silicon substrate 106 includes fluid feed holes 108 dry etched or otherwise formed therein to enable fluid flow through the substrate 106 from a first exterior surface 110 to a second exterior surface 112. The silicon substrate 106 further includes a thin silicon cap 114 (i.e., a cap over the silicon substrate 106) adjacent to and covering the first exterior surface 110. The silicon cap 114 is on the order of 30 microns in thickness and can be formed of silicon or some other suitable material.

Formed on the second exterior surface 112 of substrate 106 are one or more layers 116 that define a fluidic architecture that facilitates the ejection of fluid drops from the printhead structure 100. The fluidic architecture defined by layers 116 generally includes ejection chambers 118 having corresponding orifices 120, a manifold (not shown), and other fluidic channels and structures. The layer(s) 116 can include, for example, a chamber layer formed on the substrate 106 with a separately formed orifice layer over the chamber layer, or they can include a monolithic layer that combines the chamber and orifice layers. Layer(s) 116 are typically formed of an SU8 epoxy or some other polyimide material.

In addition to the fluidic architecture defined by layer(s) 116 on silicon substrate 106, the printhead die 102 includes integrated circuitry formed on the substrate 106 using thin film layers and elements not shown in FIG. 1. For example, corresponding with each ejection chamber 118 is a thermal ejector element or a piezoelectric ejector element formed on substrate 106. The ejection elements are actuated to eject drops or streams of ink or other printing fluid from chambers 118 through orifices 120.

The printhead structure 100 also includes signal traces or other conductors 122 connected to printhead die 102 at electrical terminals 124 formed on substrate 106. Conductors 122 can be formed on structure 100 in various ways. For example, conductors 122 can be formed in an insulating layer 126 as shown in FIG. 1, by a lamination or deposition process. Insulating layer 126 is typically a polymer material that provides physical support and insulation for conductors 122. In other examples, conductors 122 can be molded into molded body 104.

A saw defined fluid channel 128 is formed through the molded body 104 and the thin silicon cap 114, and connects with the printhead die substrate 106 at the exterior surface 110. The fluid channel 128 opens a pathway through the molded body and thin silicon cap 114 that enables fluid to flow directly into the silicon substrate 106 through the fluid feed holes 108, and onto the silicon substrate 106 at exterior surface 110. As discussed in further detail below, the fluid channel 128 is formed through the molded body 104 using a cutting saw such as a rotary cutting saw.

Figure 2:
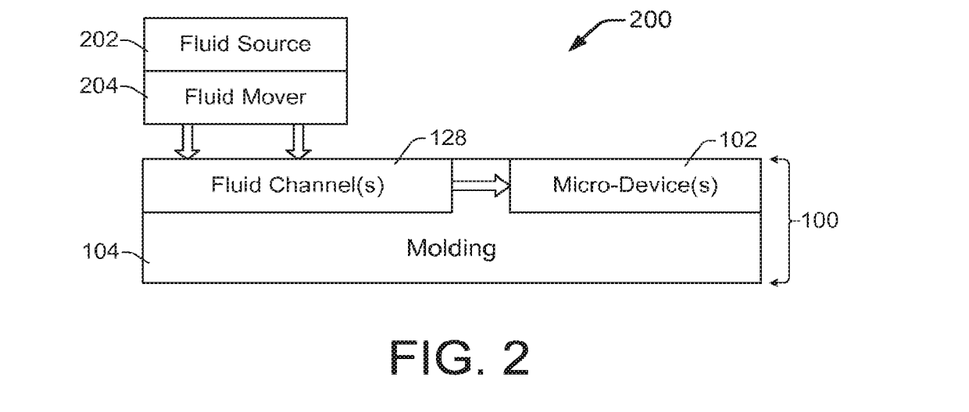
FIG. 2 is a block diagram illustrating an example system implementing a molded fluid flow structure such as the printhead structure of FIG. 1.

FIG. 2 is a block diagram illustrating a system 200 implementing a molded fluid flow structure 100 such as the printhead structure 100 shown in FIG. 1. System 200 includes a fluid source 202 operatively connected to a fluid mover 204 configured to move fluid to a channel 128 in fluid flow structure 100, such as a saw defined fluid channel 128 in a printhead structure 100. A fluid source 202 might include, for example, the atmosphere as a source of air to cool an electronic micro device 102 or a printing fluid supply for a printhead die 102. Fluid mover 204 represents a pump, a fan, gravity or any other suitable mechanism for moving fluid from source 202 to flow structure 100.

Figure 3:
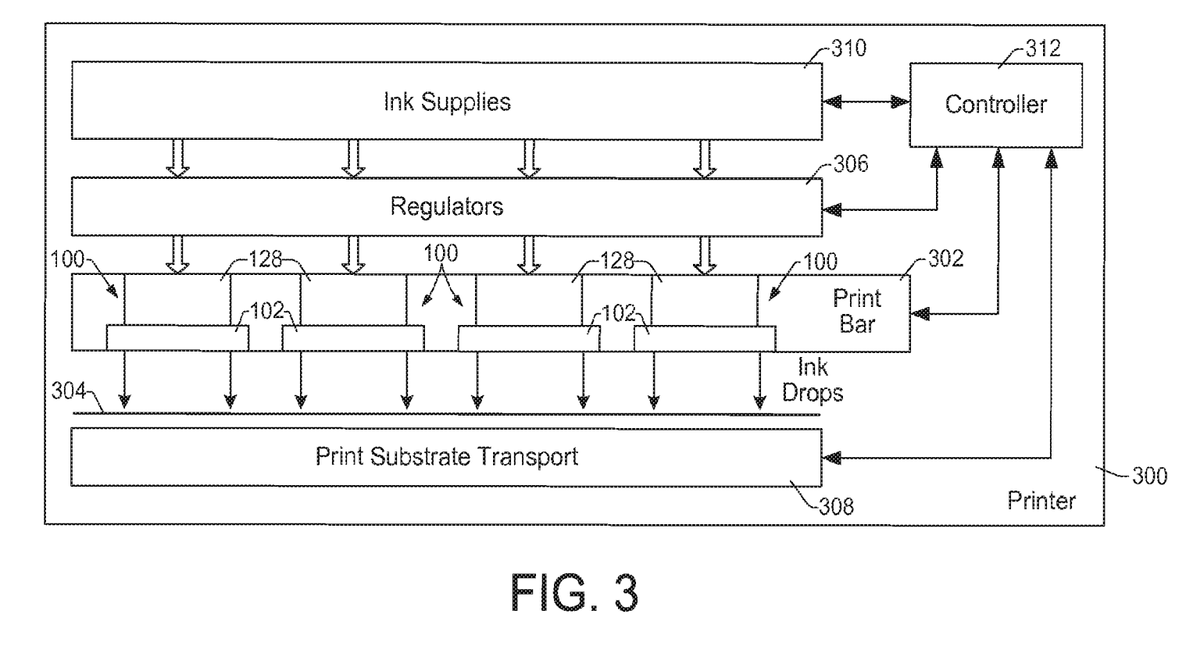
FIG. 3 is a block diagram illustrating an inkjet printer implementing one example of a fluid flow structure in a substrate wide print bar.

FIG. 3 is a block diagram illustrating an inkjet printer 300 implementing one example of a fluid flow structure 100 in a substrate wide print bar 302. Printer 300 includes print bar 302 spanning the width of a print substrate 304, flow regulators 306 associated with print bar 302, a substrate transport mechanism 308, ink or other printing fluid supplies 310, and a printer controller 312. Controller 312 represents the programming, processor(s) and associated memories, and the electronic circuitry and components needed to control the operative elements of a printer 300. Print bar 302 includes an arrangement of printhead dies 102 for dispensing printing fluid on to a sheet or continuous web of paper or other print substrate 304. Each printhead die 102 receives printing fluid through a flow path from supplies 310 into and through flow regulators 306 and fluid channels 128 in print bar 302.

Figure 4:
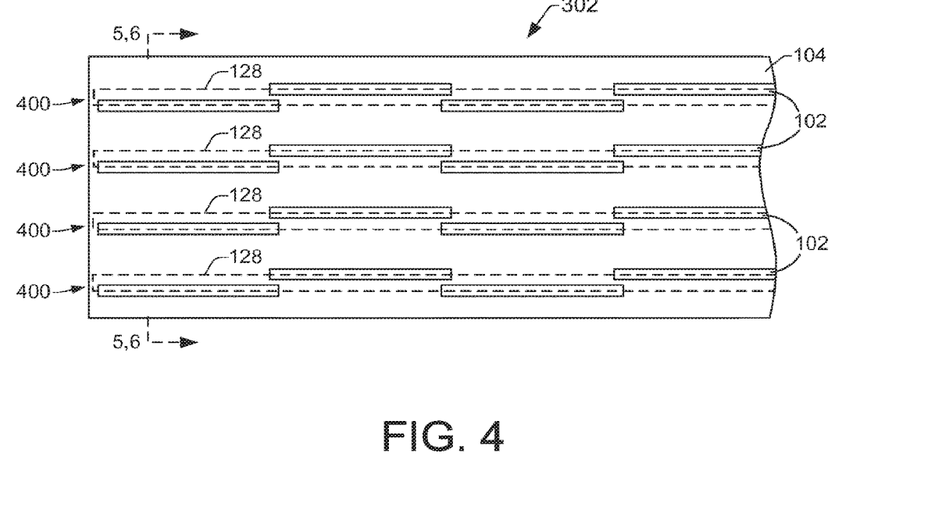
FIGS. 4-6 illustrate an inkjet print bar implementing one example of a molded fluid flow structure as a printhead structure suitable for use in printer.
Figure 5:
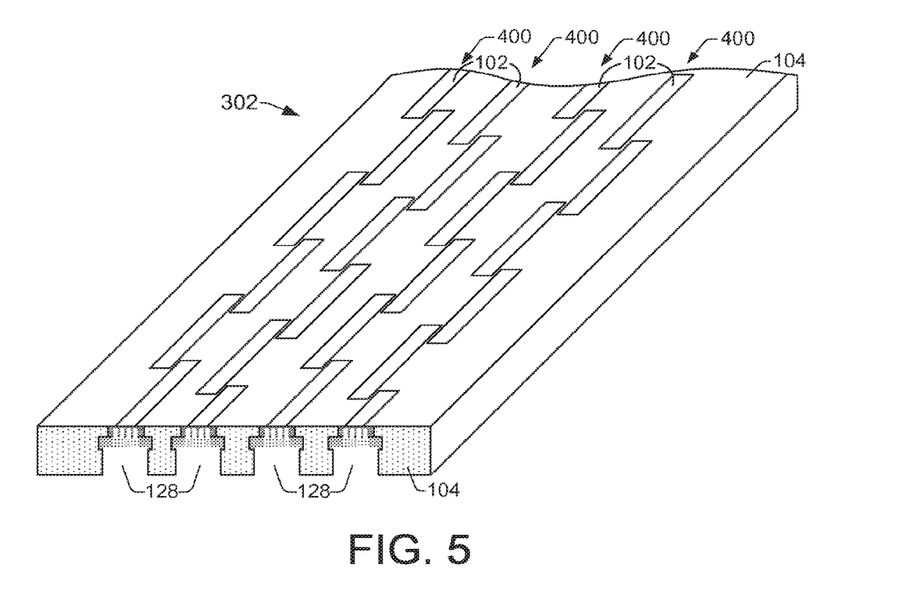
Figure 6:
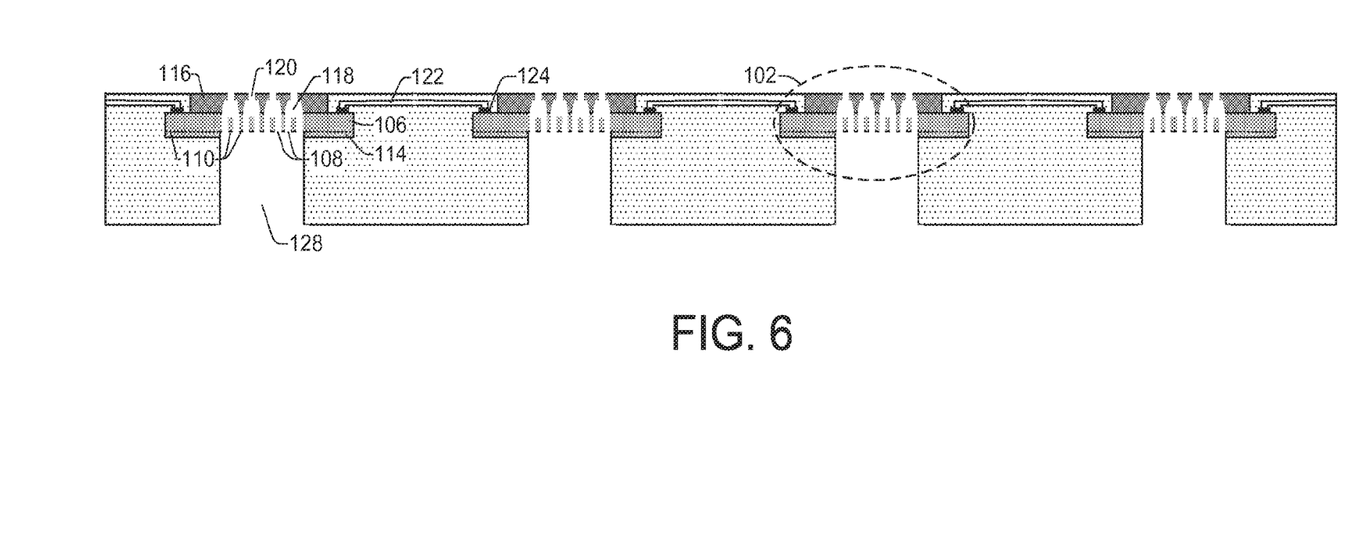

FIGS. 4-6 illustrate an inkjet print bar 302 implementing one example of a molded fluid flow structure 100 as a printhead structure 100 suitable for use in printer 300 of FIG. 3. Referring to the plan view of FIG. 4, printhead dies 102 are embedded in an elongated, monolithic molding 104 and arranged generally end to end in rows 400 in a staggered configuration in which the printhead dies 102 in each row overlap another printhead die in that same row. In this configuration, each row 400 of printhead dies 102 receives printing fluid from a different saw defined fluid channel 128 (illustrated with dashed lines in FIG. 4). Although four fluid channels 128 feeding four rows 400 of staggered printhead dies 102 is shown (e.g., for printing four different colors), other suitable configurations are possible. FIG. 5 illustrates a perspective section view of the inkjet print bar 302 taken along line 5-5 in FIG. 4, and FIG. 6 illustrates a section view of the inkjet print bar 302 taken along line 5-5 in FIG. 4. The section view of FIG. 6 shows various details of a printhead structure 100 as discussed above regarding FIG. 1.

While a particular shape or configuration of a saw defined fluid channel 128 has been generally illustrated and discussed with reference to FIGS. 1-6, a variety of differently configured fluid channels 128 are achievable using a cutting saw. As discussed below, FIGS. 11-15 illustrate examples of differently shaped, saw defined fluid channels 128 that can be readily cut into a molded body 104 of a fluid flow structure 100 using cutting saws having differently shaped peripheral saw blade edges such as those shown in FIGS. 7-9.

Figure 7:
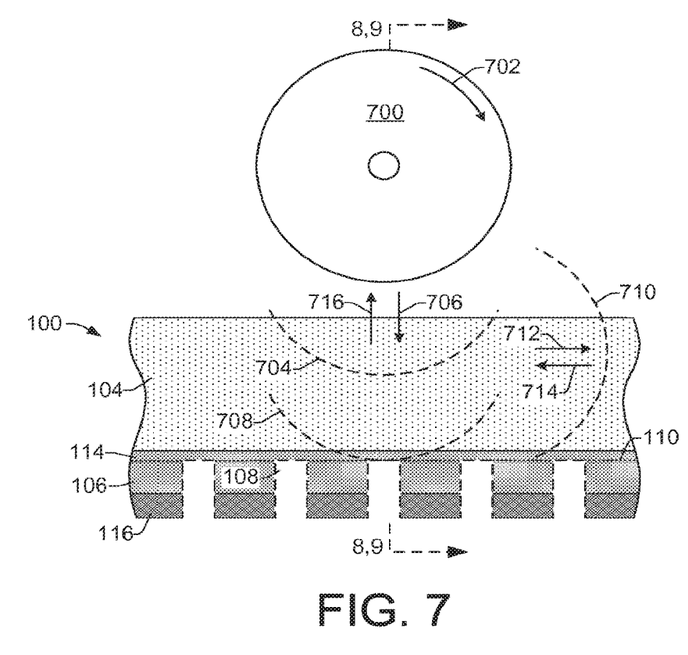
FIGS. 7-9 illustrate an example process for defining a fluid channel within a molded body of a fluid flow structure using a rotary cutting saw.
Figure 8:
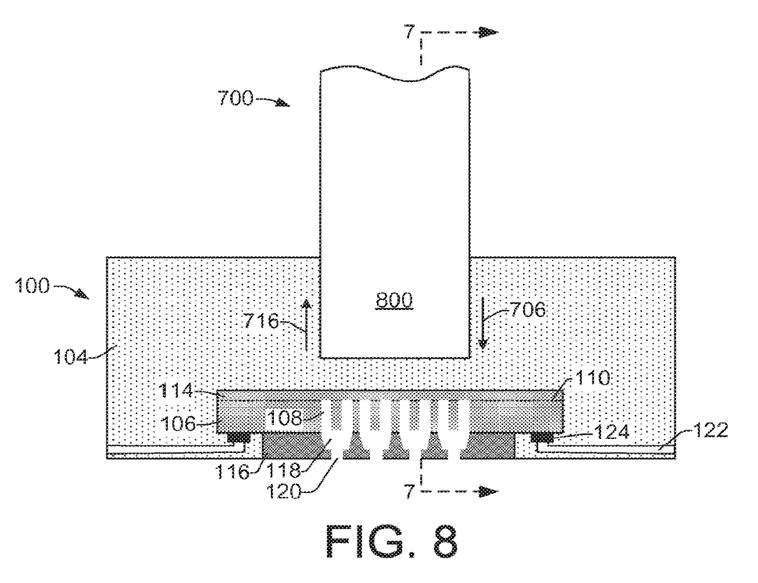
Figure 9:
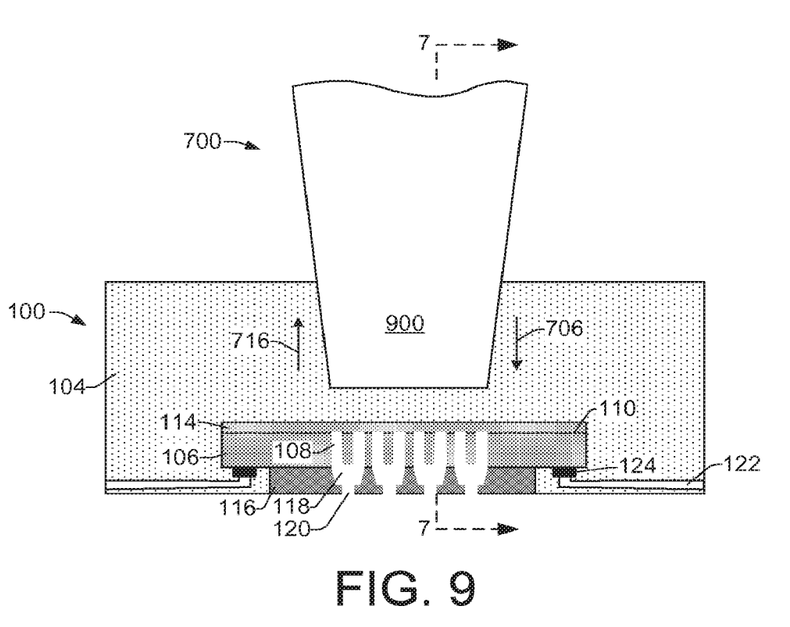
Figure 17:
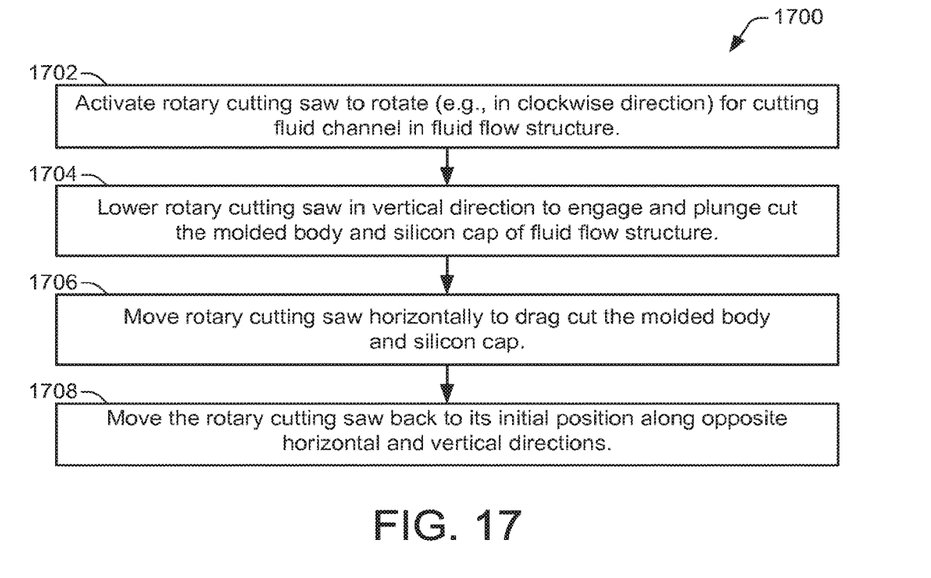
FIG. 17 is a flow diagram of the example process for defining a fluid channel within a molded body of a fluid flow structure using a rotary cutting saw as illustrated in FIGS. 7-9.

FIGS. 7-9 illustrate an example process for defining a fluid channel 128 within a molded body 104 of a fluid flow structure 100 using a rotary cutting saw 700. FIG. 17 is a flow diagram 1700 of the process illustrated in FIGS. 7-9. FIG. 7 shows a side elevation view illustrating an example method of forming a saw defined fluid channel 128 in a molded fluid flow structure 100. The side elevation view of FIG. 7 is taken along line 7-7 in both FIGS. 8 and 9. FIG. 8 shows an elevation section view illustrating an example method of forming a saw defined fluid channel 128 in a molded fluid flow structure 100 using a rotary cutting saw 700 having a generally squared peripheral saw blade edge 800. The generally squared peripheral saw blade edge 800 is characterized by the sides of the rotary saw 700 remaining parallel to one another all the way to the peripheral edge of the saw. FIG. 9 shows an elevation section view illustrating an example method of forming a saw defined fluid channel 128 in a molded fluid flow structure 100 using a rotary cutting saw 700 having a generally tapered peripheral saw blade edge 900. The generally tapered peripheral saw blade edge 900 is characterized by the sides of the rotary saw 700 diverging inward toward one another near the peripheral edge of the saw. The section views of FIGS. 8 and 9 are taken along lines 8-8 and 9-9 in FIG. 7.

Referring now primarily to FIG. 700 and FIG. 17, while the molded fluid flow structure 100 is held in a fixed position, the rotary cutting saw 700 is activated to rotate, for example, in a clockwise direction 702 to begin cutting a fluid channel 128 in the structure 100 (step 1702 in FIG. 17). The peripheral cutting edge (e.g., 800, 900) of rotary cutting saw 700 can be jagged and/or have an abrasive material formed thereon in order to perform the cutting operation as the saw rotates. For example, the saw 700 can have a diamond encrusted cutting edge. The rotary cutting saw 700 is lowered in a vertical direction to engage and plunge cut the molded body 104 (see dashed line representation 704 of the saw 700) (step 1704 in FIG. 17). In particular, the rotary cutting saw 700 is moved in a first direction 706 perpendicular to the exterior surface 110 of silicon substrate 106 to partially form the fluid channel 128 in the molded body 104 and the silicon cap 114. That is, the saw 700 is lowered through both the molded body 104 and the silicon cap 114 (see dashed line representation 708 of the saw 700) which partially forms the fluid channel 128. The rotary cutting saw 700 is then moved horizontally to drag cut the molded body 104 and silicon cap 114 (see dashed line representation 710 of the saw 700) (step 1706 in FIG. 17). In particular, the rotary cutting saw 700 is moved in a second direction 712 parallel to the exterior surface 110 of silicon substrate 106 to complete formation of the fluid channel 128. The rotary cutting saw 700 can then be moved along horizontal direction 714 and vertical direction 716 back to its initial position (step 1708 in FIG. 17).

The variously shaped, saw defined fluid channels 128 shown in FIGS. 11-15 are formed in the same general manner as just discussed above regarding FIG. 7. However, in forming different shaped channels 128, rotary saw blades having differently shaped peripheral cutting edges (e.g., FIG. 8, 800; FIG. 9, 900) can be used separately or in combination, and in varying orders of application to the molded fluid flow structure 100. Furthermore, while the fluid channels 128 are formed such that they run generally parallel to the length of an elongated, monolithic molded body (see FIGS. 4-6), and in correspondence with the lengths of the printhead dies 102, channels can also be saw cut in different orientations, such as orientations that are perpendicular to those illustrated. Channels cut in such a manner can route fluid through the fluid flow structure 100 in different directions and for varying purposes. For example, channels cut perpendicular to those shown in FIGS. 4-6, can serve to join two parallel channels with a perpendicular channel link.

Figure 10:
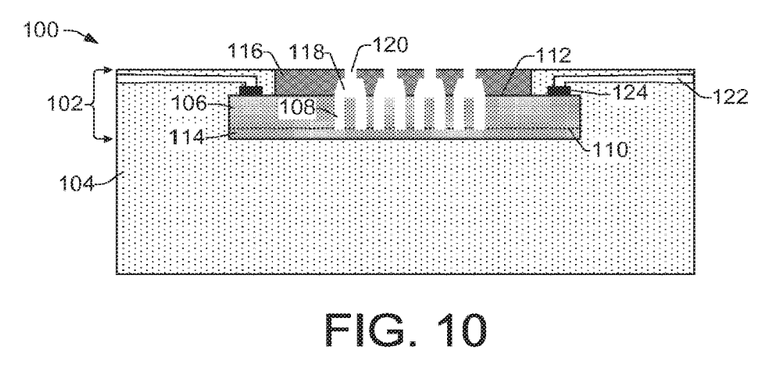
FIG. 10 illustrates an example of a molded fluid flow structure prior to the formation of a saw defined fluid channel.

Referring now to FIG. 10, a molded fluid flow structure 100 is shown prior to the formation of a saw defined fluid channel 128. The fluid flow structure 100 is configured in the same general manner as discussed above with regard to FIG. 1, except that the conductors 22 are shown embedded within the molded body 104 rather than within a separate insulating layer 126. This configuration is used throughout FIGS. 10-15 for the general purpose of simplifying the illustrations.

Figure 11:
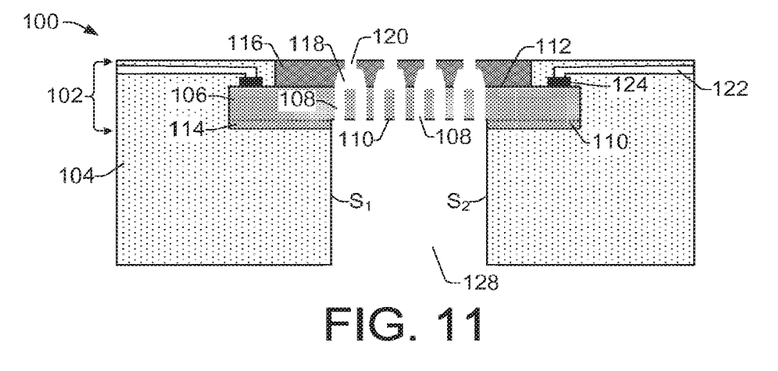
FIGS. 11-15 illustrate examples of differently shaped, saw defined fluid channels that can be cut into a molded body of a fluid flow structure.

Referring now to FIG. 11, a saw defined fluid channel 128 has been formed with first and second side walls, $S_1$ and $S_2$, that are substantially parallel to one another. The parallel side walls $S_1$ and $S_2$, can be formed, for example, using a rotary cutting saw 700 as shown in FIG. 8. The rotary cutting saw 700 of FIG. 8 has a generally squared peripheral saw blade edge 800 characterized by parallel blade sides, which when plunged into the molded body 104 of fluid flow structure 100 removes molding material and silicon from the thin silicon cap 114, leaving substantially parallel saw cut side walls, $S_1$ and $S_2$.

Figure 12:
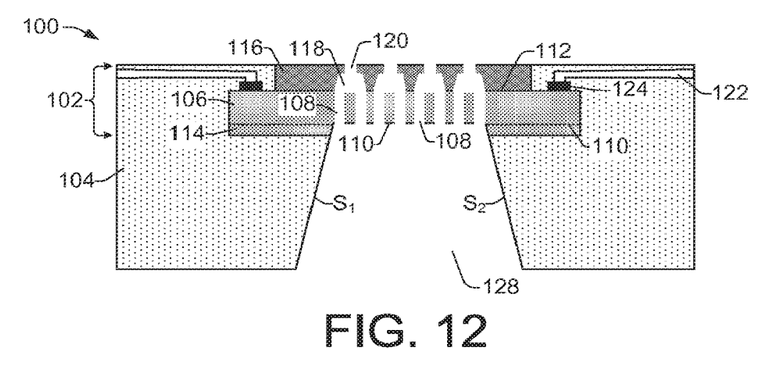

FIG. 12 illustrates a saw defined fluid channel 128 formed with first and second side walls, $S_1$ and $S_2$, that are tapered with respect to one another. The tapered side walls taper toward one another as they get closer to the fluid feed holes 108 in substrate 106, and away from one another as they recede from substrate 106. The tapered side walls $S_1$ and $S_2$, can be formed, for example, using a rotary cutting saw 700 as shown in FIG. 9. The rotary cutting saw 700 of FIG. 9 has a generally tapered peripheral saw blade edge 900 characterized by the sides of the rotary saw 700 diverging inward toward one another near the peripheral edge of the saw. When plunged into the molded body 104 of fluid flow structure 100 the saw with saw blade edge 900 removes molding material and silicon from the thin silicon cap 114, leaving tapered, saw cut side walls, $S_1$ and $S_2$.

Figure 13:
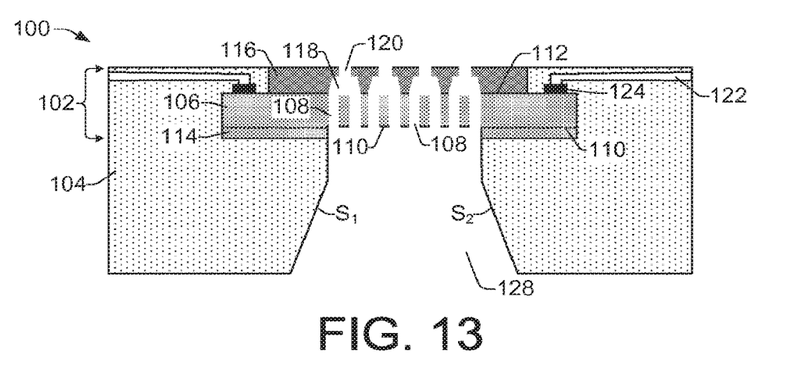
Figure 14:
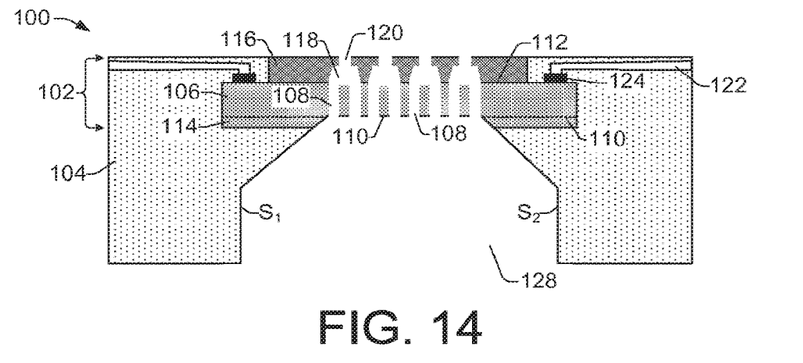
Figure 15:
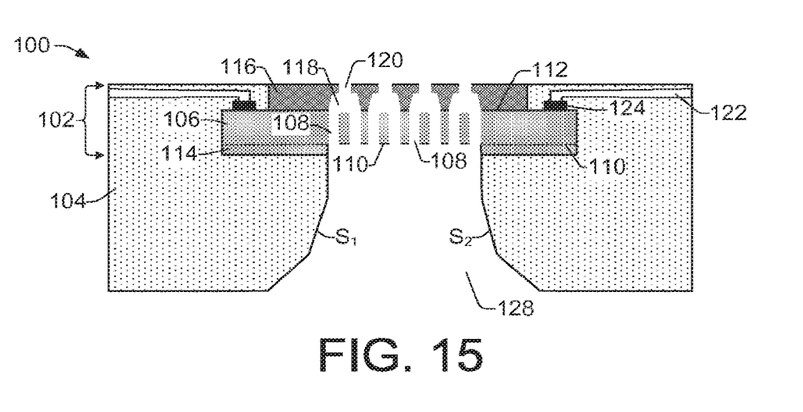

FIGS. 13, 14, and 15, each illustrates a saw defined fluid channel 128 formed with first and second side walls, $S_1$ and $S_2$, that are both substantially parallel and tapered with respect to one another. The parallel sections of side walls $S_1$ and $S_2$, can be formed using a rotary cutting saw 700 as shown in FIG. 8, and the tapered sections of side walls $S_1$ and $S_2$, can be formed using a rotary cutting saw 700 as shown in FIG. 9. Sidewall sections having different tapering angles are formed using cutting saws 700 as shown in FIG. 9 whose sides have varying angles of divergence inward toward one another as they near the peripheral edge of the saw.

In FIG. 13, the parallel sections of side walls $S_1$ and $S_2$ are adjacent to the sliver substrate 106, and the tapered sections taper inward toward one another to meet the parallel sections. In FIG. 14, the tapered sections of side walls $S_1$ and $S_2$ are adjacent to the sliver substrate 106. The tapered sections taper toward one another to meet the sliver substrate 106 and taper away from one another to meet the parallel side wall sections. In FIG. 15, parallel sections of side walls $S_1$ and $S_2$ are adjacent to the sliver substrate 106, and a first set of tapered sections taper inward toward one another to meet the parallel sections. A second set of tapered sections taper inward to meet the first set of tapered sections.

In general, the saw cut fluid channels 128 shown in FIGS. 11-15 have channel side walls, $S_1$ and $S_2$, formed in various parallel and or tapered configurations. Channel side walls that diverge or taper away from one another as they recede from the printhead sliver substrate 106 provide the benefit of helping air bubbles move away from the orifices 120, ejection chambers 118, and fluid feed holes 108, where they may otherwise hinder or prevent the flow of fluid. Accordingly, the fluid channels 128 shown in FIGS. 11-15 comprise side walls that are parallel and/or divergent as they recede from the sliver substrate 106. However, the illustrated channel side wall configurations are not intended to be a limitation as to other shapes and configurations of side walls within saw defined fluid channels 128. Rather, this disclosure contemplates that other saw defined fluid channels are possible that have side walls shaped in various other configurations not specifically illustrated or discussed.

Figure 16:
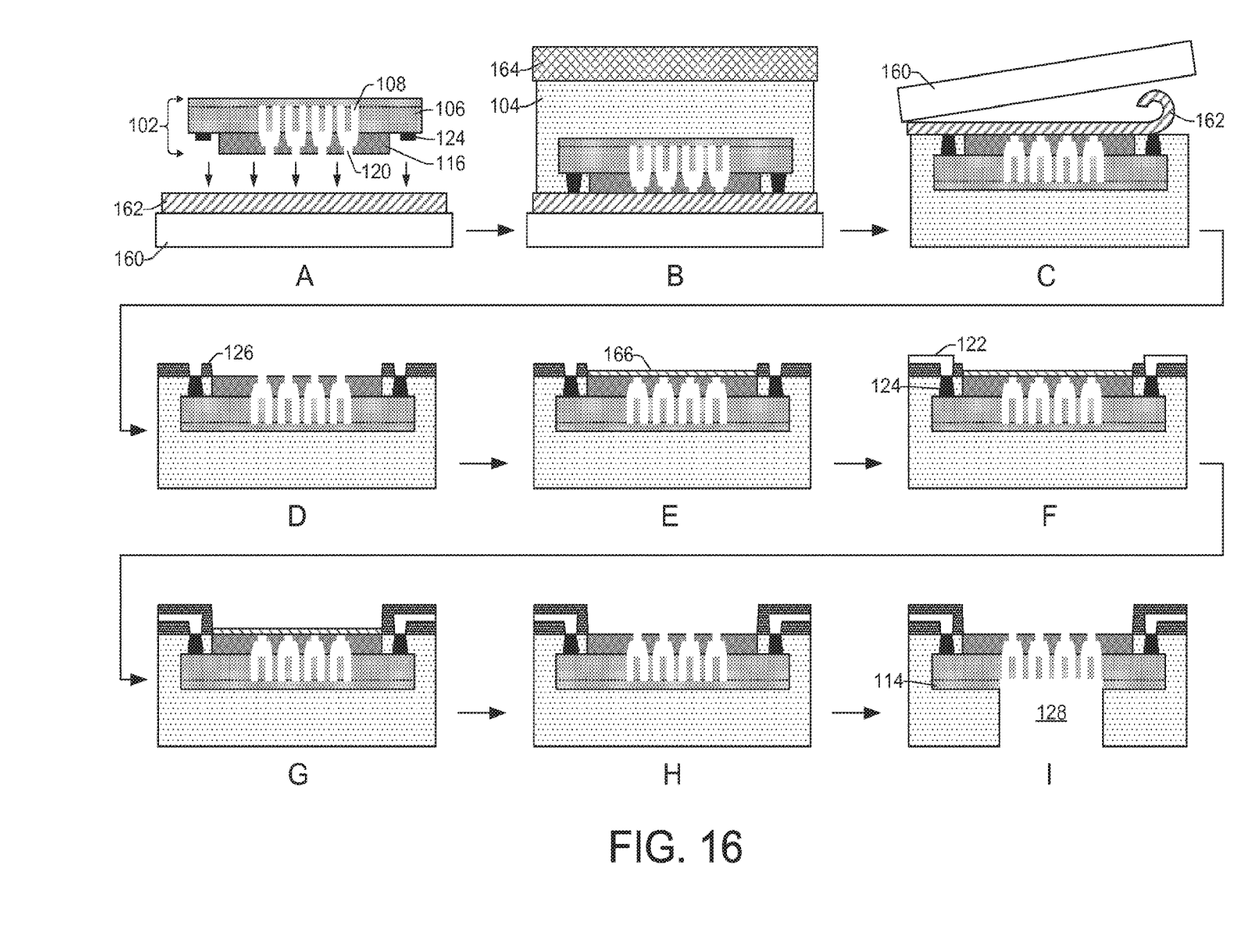
FIG. 16 illustrates an example process for making a printhead fluid flow structure having a saw defined fluid channel.
Figure 18:
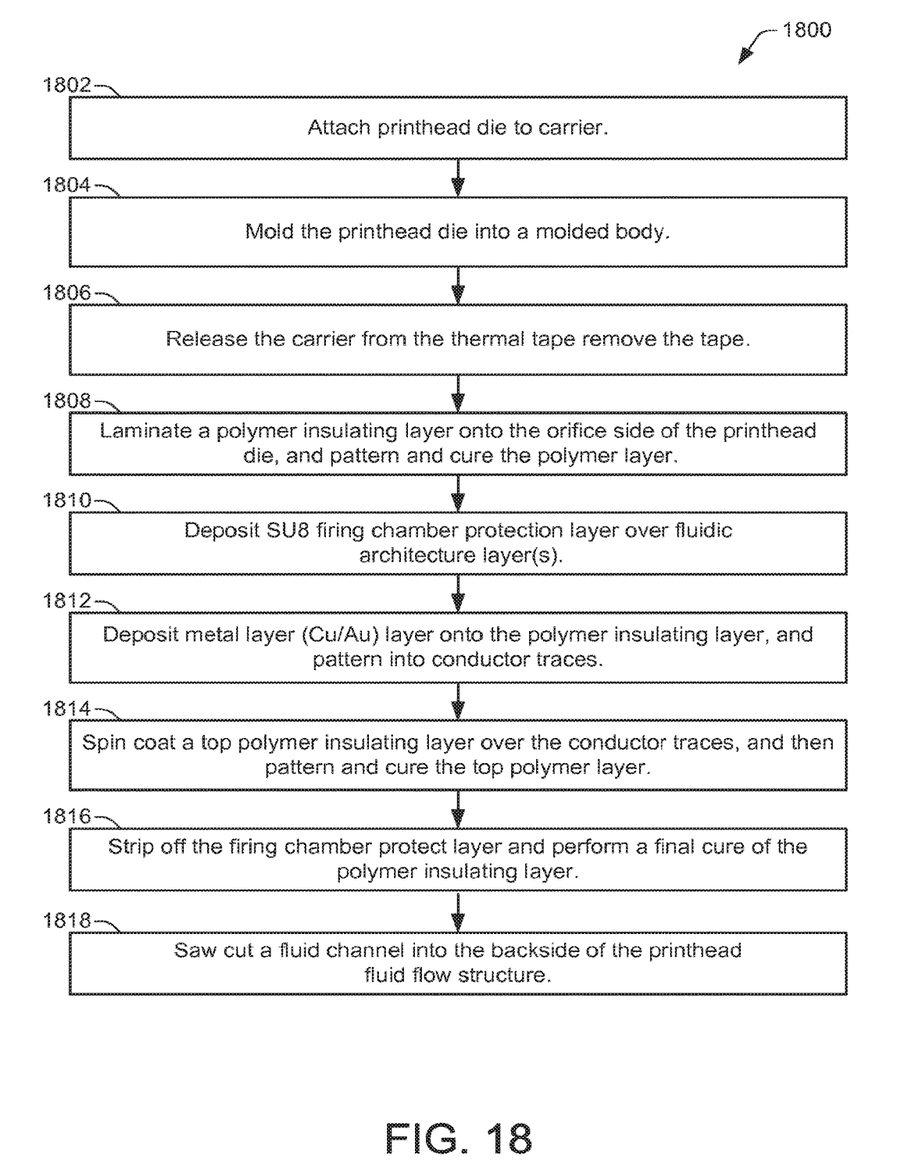
FIG. 18 is a flow diagram of the example process for making a printhead fluid flow structure having a saw defined fluid channel as illustrated in FIG. 16.

FIG. 16 illustrates an example process for making a printhead fluid flow structure 100 having a saw defined fluid channel 128. FIG. 18 is a flow diagram 1800 of the process illustrated in FIG. 16. As shown in FIG. 16 at part "A" a printhead die 102 is attached to a carrier 160 using a thermal release tape 162 (step 1802 in FIG. 18). The printhead die 102 is placed with the orifice side down onto the carrier 160. The printhead die 102 is in a pre-processed state such that it already includes layer(s) 116 defining fluidic architectures (e.g., ejection chambers 118, orifices 120), and electrical terminals 124 and ejection elements (not shown) formed on a sliver substrate 106. Fluid feed holes 108 have also already been dry etched or otherwise formed in sliver substrate 106.

As shown at part "B" of FIG. 16, the printhead die 102 is molded into a molded body 104 (step 1804 in FIG. 18). In one example, the die 102 is compression molded using a mold top 164. As shown at part "C" of FIG. 16, the carrier 160 is released from the thermal tape 162 and the tape is removed (step 1806 in FIG. 18). At part "D" of FIG. 16, a polymer insulating layer 126 is laminate onto the orifice side of the printhead die 102, and then patterned and cured (step 1808 in FIG. 18). An SU8 firing chamber protection layer 166 is deposited over the fluidic architecture layer(s) 116, as shown in FIG. 16 at part "E" (step 1810 in FIG. 18). At part "F" as shown in FIG. 16, a metal layer (Cu/Au) is deposited onto the polymer insulating layer 126 and patterned into conductor traces 122 (step 1812 in FIG. 18). A top polymer insulating layer 126 is then spin coated over the conductor traces 122, and then patterned and cured as shown at part "G" of FIG. 16 (step 1814 in FIG. 18). At part "H" of FIG. 16, the firing chamber protect layer 166 is stripped off and a final cure of the polymer insulating layer 126 is performed (step 1816 in FIG. 18). As shown at part "I" of FIG. 16, a saw cut fluid channel 128 is then formed into the backside of the printhead fluid flow structure 100. The fluid channel 128 is formed as described above regarding the fluid channel forming process shown in FIGS. 7 and 17. The fluid channel 128 can be configured in various shapes such as those discussed above with reference to FIGS. 11-15.

What is claimed is:

1. A printhead structure, comprising:
    printhead dies embedded in a molded body, the printhead dies arranged in a row in an end-to-end staggered configuration and each including a substrate having fluid feed holes formed therethrough; and
    a saw defined common fluid channel cut through the molded body to the fluid feed holes of each of the printhead dies.

2. A structure as in claim 1, wherein the printhead dies each include a cap on the substrate over the fluid feed holes, and wherein the common fluid channel is cut through the caps of the printhead dies to fluidically couple the fluid feed holes with the common fluid channel.

3. A structure as in claim 2, wherein opposite ends of both the substrates and the caps of the printhead dies are embedded in the molded body.

4. A structure as in claim 1, wherein the printhead dies each include ejection chambers having corresponding orifices.

5. A structure as in claim 1, wherein the common fluid channel comprises first and second substantially parallel side walls.

6. A structure as in claim 1, wherein the common fluid channel comprises first and second tapered side walls.

7. A structure as in claim 6, wherein the tapered side walls taper inward toward the fluid feed holes of the printhead dies.

8. A structure as in claim 1, wherein the common fluid channel comprises first and second side walls that include both tapered side wall sections and substantially parallel side wall sections.

9. A structure as in claim 1, wherein the printhead dies include first and second pluralities of printhead dies embedded in the molded body, the first plurality of printhead dies arranged in a first row in an end-to-end staggered configuration and the second plurality of printhead dies arranged in a second row in an end-to-end staggered configuration, and wherein the saw defined common fluid channel includes a first saw defined common fluid channel cut through the molded body to the fluid feed holes of the first plurality of printhead dies and a second saw defined common fluid channel cut through the molded body to the fluid feed holes of the second plurality of printhead dies.

10. A printhead structure, comprising:
    a first row of staggered printhead dies, each of the staggered printhead dies of the first row overlapped with another of the staggered printhead dies of the first row;
    a second row of staggered printhead dies, each of the staggered printhead dies of the second row overlapped with another of the staggered printhead dies of the second row;
    the staggered printhead dies of the first row and the staggered printhead dies of the second row embedded within a monolithic molded body;
    a first fluid channel saw cut through the monolithic molded body to the staggered printhead dies of the first row; and
    a second fluid channel saw cut through the monolithic molded body to the staggered printhead dies of the second row.

11. A structure as in claim 10, wherein each of the staggered printhead dies of the first row and the second row include a substrate having fluid feed holes formed therethrough and a cap on the substrate over the fluid teed holes, and wherein the first fluid channel and the second fluid channel are saw cut through the monolithic molded body and through the caps of the respective staggered printhead dies of the first row and the second row.

12. A method of making a printhead structure, comprising:
    embedding printhead dies within a molded body, the printhead dies arranged in a row in an end-to-end staggered configuration and each including a substrate having fluid feed holes formed therethrough; and
    cutting a common fluid channel through the molded body to the fluid feed holes of each of the printhead dies with a rotary saw.

13. A method as in claim 12, wherein the printhead dies each include a cap over the fluid feed holes, and wherein cutting the common fluid channel includes cutting the common fluid channel through the caps of the printhead dies with the rotary saw.

14. A method as in claim 13, wherein embedding the printhead dies within the molded body includes embedding opposite ends of both the substrates and the caps of the printhead dies within the molded body.

15. A method as in claim 12, wherein the printhead dies each include ejection chambers having corresponding orifices.

16. A method as in claim 12, wherein cutting the common fluid channel comprises forming the common fluid channel with tapered side walls.

17. A method as in claim 16, wherein the tapered side walls taper inward toward the substrates of the printhead dies.

18. A method as in claim 12, herein cutting the common fluid channel comprises forming the common fluid channel with substantially parallel side walls.

19. A method as in claim 12, wherein cutting the common fluid channel includes plunge cutting the rotary saw through the molded body and, after the plunge cutting, drag cutting the rotary saw along the molded body.

20. A method as in claim 12, wherein embedding the printhead dies within the molded body includes embedding first and second pluralities of printhead dies within the molded body, the first plurality of printhead dies arranged in a first row in an end-to-end staggered configuration and the second plurality of printhead dies arranged in a second row in an end-to-end staggered configuration, and wherein cutting the common fluid channel includes cutting a first common fluid channel through the molded body to the first plurality of printhead dies with the rotary saw and cutting a second common fluid channel through the molded body to the second plurality of printhead dies with the rotary saw.

* * * * *

UNITED STATES PATENT AND TRADEMARK OFFICE
CERTIFICATE OF CORRECTION

PATENT NO. : 10,081,188 B2
APPLICATION NO. : 15/485064
DATED : September 25, 2018
INVENTOR(S) : Chien-Hua Chen et al.

Page 1 of 1

It is certified that error appears in the above-identified patent and that said Letters Patent is hereby corrected as shown below:

In the Claims

In Column 8, Line 52, Claim 11, delete "teed" and insert -- feed --, therefor.

In Column 9, Line 16, Claim 18, delete "herein" and insert -- wherein --, therefor.

Signed and Sealed this
Twelfth Day of March, 2019

Andrei Iancu
*Director of the United States Patent and Trademark Office*